United States Patent
Turunen

(10) Patent No.: US 6,201,694 B1
(45) Date of Patent: Mar. 13, 2001

(54) PROTECTIVE STRUCTURE

(75) Inventor: Timo Turunen, Kungsängen (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/288,809

(22) Filed: Apr. 9, 1999

(30) Foreign Application Priority Data

Apr. 9, 1998 (SE) .................................................. 9801270

(51) Int. Cl.[7] ........................................................ H05K 7/20
(52) U.S. Cl. .................. 361/695; 165/104.33; 312/223.1
(58) Field of Search ................................... 62/259.2, 418, 62/419; 454/184; 174/15.1, 16.1; 361/690, 694, 695, 699, 700; 165/80.3, 104.33, 104.34; 312/223.1, 236, 265.1

(56) References Cited

U.S. PATENT DOCUMENTS

| | | |
|---|---|---|
| 3,559,728 * | 2/1971 | Lyman . |
| 3,662,667 | 5/1972 | Murawski et al. . |
| 4,535,386 * | 8/1985 | Frey, Jr. . |
| 4,858,069 * | 8/1989 | Hughes . |
| 5,150,277 | 9/1992 | Bainbridge et al. . |
| 6,060,966 * | 5/2000 | Tennant . |

FOREIGN PATENT DOCUMENTS

| | | |
|---|---|---|
| 1131744 | 9/1982 | (CA) . |
| 1131774 | 9/1982 | (CA) . |
| 24 24 722 | 11/1975 | (DE) . |
| 31 03 687 | 9/1982 | (DE) . |
| 2217520 | 10/1989 | (GB) . |
| 2 284 659 | 6/1995 | (GB) . |
| 2284659 | 6/1995 | (GB) . |
| 97/471167 | 12/1997 | (WO) . |
| WO 9747167 A1 | 12/1997 | (WO) . |

* cited by examiner

*Primary Examiner*—Gerald Tolin
(74) *Attorney, Agent, or Firm*—Burns, Doane, Swecker & Mathis, L.L.P.

(57) ABSTRACT

The present invention relates to a cabinet structure for housing electronic circuitry and electronic equipment. The electronic circuitry/equipment is surrounded by a body which includes compression-moulded profile elements (30, 31) The structure also includes a front piece (10, 10a, 10b) and a back piece (2c, 4c), which together close the two open sides of the body against the electronic circuitry/equipment.

16 Claims, 5 Drawing Sheets

PROTECTIVE STRUCTURE

FIELD OF INVENTION

The present invention relates to a structure for housing electronic circuitry and electronic equipment.

BACKGROUND OF THE INVENTION

Cabinets for housing electronic circuitry and equipment are used in a number of different areas and environments, for instance in industrial and office environments. A common feature of so-called single-wall electronic cabinets is that they are comprised of a plurality of different parts, regardless of the field in which they are used. A cabinet often comprises an open frame-work which fully covered with protective material, such as sheet-metal panels. The framework itself comprises several parts and when taking into consideration the metal panels and their fastening devices such a cabinet will include a significant number of different component parts. This results in high manufacturing and assembly costs.

Another area in which electronic equipment housing cabinets are used is in the field of radio technology, for instance in the mobile telephone industry. In the case of mobile telephony, a mobile communicates with the aid of radio signals that are sent/received to/from radio base stations. Radio base stations are often located outdoors, in a temperature/moisture climate which affects the electronic circuitry and equipment. One way of protecting electronic devices against such ambient factors is to use cabinets which have a double-wall outer casing, i.e. twin metal panels with an insulating layer of air therebetween. One drawback with double-wall cabinets is that both the manufacturing costs and the assembly costs are higher than in the case of single-wall cabinets. As before mentioned, single-wall cabinets represent a high user cost. A switch from single-wall cabinets to double-wall cabinets represents significant additional costs.

SUMMARY OF THE INVENTION

The present invention addresses the problem of the large number of different parts from which an electronic equipment housing cabinet is comprised, and then particularly double-wall cabinets. This large number of component parts represents high manufacturing and assembly costs, resulting in a high total user cost.

The problems are solved by using compression moulded profile elements at least for some parts of the cabinet. The profiles are preferably made of aluminum. The advantages of these kinds of elements are that almost any kind of cross section area could be chosen. The profiles may be made to include double-walled constructions, constructions with grooves for fastening of other element, constructions with stabilizing flanges, cooling channels etc. A profile of the kind could also easily be bent without severely affecting the cross-sectional area. The profile elements are primarily used for the body structure of the cabinet, that is its top and bottom part and the side members of the cabinet. As could easily be seen, it is possible to construct the body structure out of just one bent profile element put together at just one point. The structure could also be divided into separate straight or bent profile parts, e.g. for manufactoring reasons.

A preferred embodiment of the body structure is that one bent profile element forms the upper part and the side parts while a further elongated profile, a straight profile, is used for the bottom part of the cabinet.

The profiles are designed to provide optimum support for EMC protection and environmental protection.

Another problem addressed by the invention is one of insulating the electronic equipment against electromagnetic interference from the equipment required to operate the electronic components. A climate conditioning plant is an example of such equipment. The converse problem is also addressed by the invention, i.e. the problem of protecting the surroundings from the influence of the housed electronic equipment and electronic circuitry, for instance from the electromagnetic fields generated thereby.

This problem is solved by the invention, by placing both the electronic circuitry/equipment and the climate conditioning system within the protective structure and separating said circuitry/equipment and climate conditioning system from one another by means of a sealing wall. The wall could be mounted in grooves or the like in the profiled elements of the body structure. The electronic circuitry/equipment is thus located in its own climate zone protected with a double-wall shell and insulated from the operating equipment, which is located on the other side of the partition wall in a so-called antechamber.

One object of the present invention is to reduce the number of parts required by such a protective structure.

Another object of the present invention is to protect the electronic circuitry/equipment from interference by peripheral equipment, for instance electromagnetic interference from a climate conditioning plant, without appreciably increasing the number of necessary component parts, and also to protect the surroundings from electromagnetic fields generated by the electronic circuitry/equipment.

One advantage afforded by the invention resides in a reduction in manufacturing and assembly costs.

Another advantage afforded by the invention is that assembly of the cabinet is simplified.

Yet another advantage is that the electronic circuitry/equipment is better protected against the ingress of water and dust than in earlier known cases.

Still another advantage is that the electronic circuitry is protected against electromagnetic interference—EMC.

The invention will now be described in more detail with reference to preferred embodiments thereof and also with reference to the accompanying drawings.

DETAILED DESCRIPTION OF PREFERRED EMBODIMENTS

Figure 1:
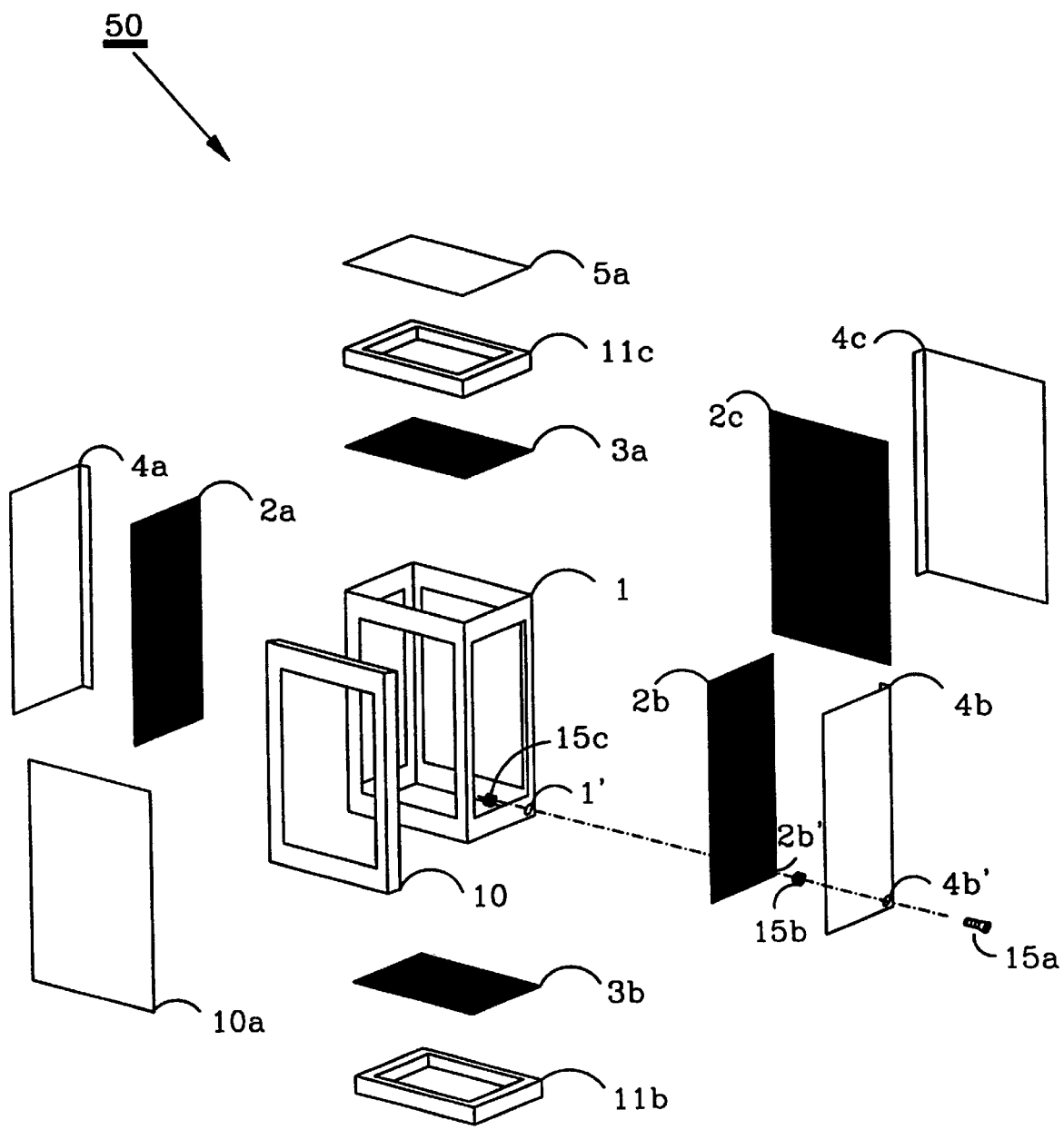
FIG. 1 is an exploded view of a known cabinet for housing electronic circuitry/equipment.

FIG. 1 illustrates a known radio base cabinet 50. The illustrated cabinet includes a cubical aluminium frame-work 1. When the cabinet is assembled, the electronic circuitry and other equipment belonging to the radio base station will be located within the area defined by the frame-work. Inner sheet-metal panels 2a, 2b are fitted to the frame-work on two sides thereof. The frame-work 1 and the metal panels include several assembly holes 1', 2b' and 4b', of which only a few are shown in FIG. 1. The assembly holes provide fastening points in the frame-work for fastening the panels 2a, 2b thereto. The panels are secured with the aid of screws, spacing washers and nuts, among other things. A cabinet will normally include from between 50 and 100 fastener elements, although only one screw 15a, one washer 15b and one nut 15c have been shown in FIG. 1. A rear inner sheet-metal panel 2c is fastened to rear side of the frame-work. A top inner sheet-metal panel 3a and a bottom inner sheet-metal panel 3b are mounted on respective top and bottom sides of the frame-work. A door 10 is hinged on the frame-work 1. The door provides a closable opening through which access can be had to the electronic circuitry in the cabinet from without. In the illustrated case, an inner sheet-metal door panel is fitted on the door between said door and the frame-work 1. The inner sheet-metal panel has not been shown in FIG. 1, for the sake of simplicity. The inner panels 2a, 2b, 2c, 3a and 3b form, together with the inner door panel, the inner screening box or casing of the cabinet. A bottom frame 11b has been fitted to the bottom inner panel 3b and therewith forms the bottom part of the cabinet on which the assembled cabinet rests when erected. An upper frame 11c is mounted on the upper inner panel 3a. The top and bottom frames 11b and 11c form the basic body of the cabinet together with the frame-work The basic body co-operates in achieving the stability and robustness of the cabinet 50. The cabinet also includes outer sheet-metal panels, these panels comprising outer side panels 4a and 4b fitted to the inner side panels 2a and 2b through the medium of spacers 15b, such as to provide an air gap between the inner and outer panels. A rear outer panel 4c is similarly mounted on the rear inner panel 2c, so as to obtain an air gap between the panels 2c and 4c. An upper outer panel 5a is mounted on the top frame 11c, and a door outer panel 10a is mounted on the outer side of the door. The outer panels 4a, 4b, 4c and 5a form the outside of the cabinet, together with the outer door panel 10a. In summary, it can be said that a cabinet of this conventional design includes 10–15 sheet-metal panels, between 50 and 100 structure assembly elements, and a plurality of aluminium profiles. This conventional cabinet will now be compared with a cabinet constructed in accordance with the invention.

Figure 2:
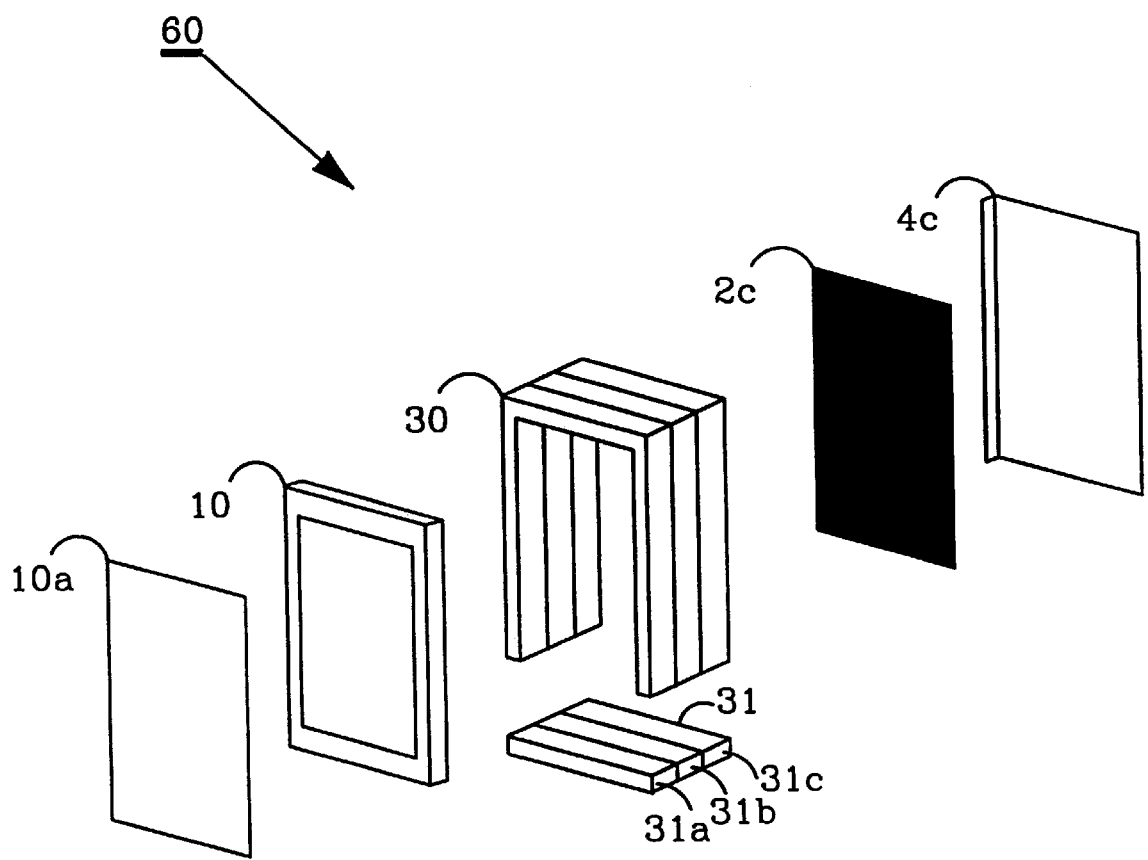
FIG. 2 is an exploded view of an inventive structure for housing electronic circuitry/equipment.

FIG. 2 illustrates an inventive cabinet 60 for housing electronic circuitry and equipment. The cabinet includes a single-piece aluminium profile 30, which is an elongated profile that has been bent into a U-shape. The angled profile forms two of the sides of the inventive cabinet and also its top. In addition to the angled profile 30, the cabinet 60 includes a straight, elongated profile 31. In the illustrated case, the two aluminium profiles 30, 31 have a rectangular cross-sectional shape. The cross-sectional shape is defined by mutually combined rectangular units, each having insulated air pockets 31a, 31b and 31c. The end-parts of the straight profile are joined to the respective end-parts of the angled profile 30, said straight profile therewith forming the bottom part of the cabinet. The profiles 30, 31 together form the body structure of the cabinet. A rear inner panel 2c is fastened proximal to the panel 30, 31 on one of its open sides, the so-called first open side. A rear outer sheet-metal panel 4c is fastened to the rear inner panel in the same way as in the case of the conventional cabinet, so as to enable an air gap to be formed between the two panels. The outer door 10 is similar to the aforedescribed outer door of the conventional cabinet. The outer door is hinged to said bodywork and sheet-metal panels are fastened to the inwardly and outwardly facing sides of said door.

A large number of the parts of the known cabinet illustrated in FIG. 1 have been replaced with the two aluminium profiles 30 and 31 of the inventive cabinet. Those parts or components of the FIG. 1 structure that have been replaced by the aluminium profiles of the inventive cabinet shown in FIG. 2 are the following:

The framework 1.

The inner side panels 2a, 2b.

The outer side panels 4a, 4b.

The upper inner panel 3a.

The bottom inner panel 3b.

The upper outer panel 5a.

The upper frame 11c.

The bottom frame 11b.

All of the fastener elements 15a, 15b (about 50–100 in total).

This comparison shows that the inventive cabinet eliminates a significant number of components required by the known cabinet. This component reduction has resulted in a reduction in manufacturing and assembly costs.

Figure 3:
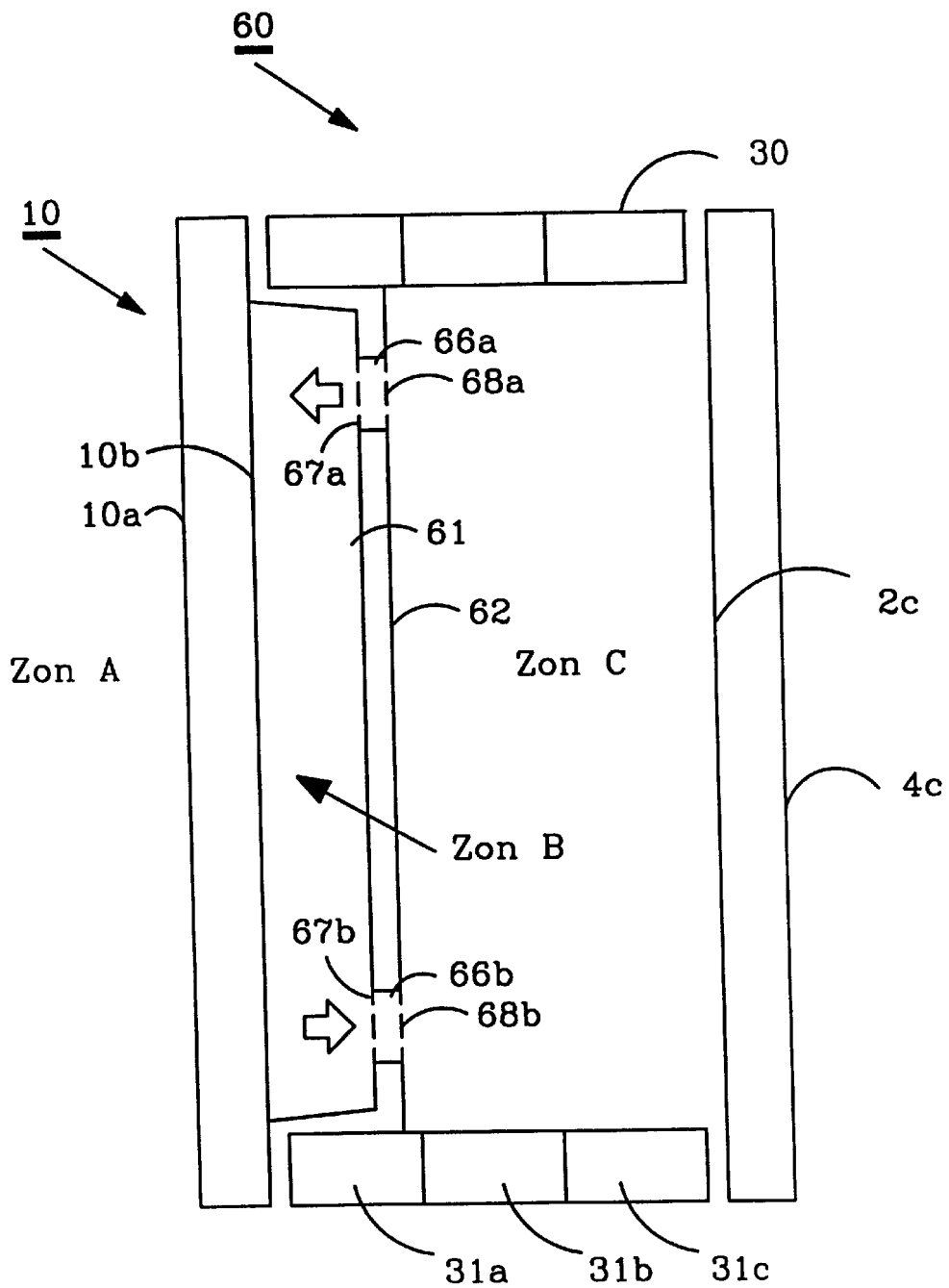
FIG. 3 is a side view of an inventive structure that includes a wall between electronic circuitry/equipment and climate conditioning plant.

FIG. 3 is a sectioned schematic side view of the cabinet 60 shown in FIG. 2. The Figure includes a sectioned illustration of both the angled profile 30 and the straight profile 31. The cross-sectional shape of the profiles is depicted by three rectangular hollow structures 31a, 31b and 31c, the cavities of which together form three air gaps in said profiles. The back piece of the cabinet is comprised of the earlier shown rear inner panel 2c which has been joined to the rear outer panel 4c. The Figure also shows the door 10, with the earlier described outer panel 10a fitted to the outside of said door and the earlier mentioned (but not shown) inner panel fitted to the inner side of said door. Also shown in FIG. 3 is a climate conditioning plant 61 mounted on the inner door panel. The climate conditioning plant 61 may be divided into separate parts to facilitate maintenance and functions to ensure that the electronic circuitry and electronic equipment housed in the cabinet will be exposed to a suitable temperature and climate. The inventive cabinet includes a partition wall 62 between the climate conditioning plant 61 and the electronic circuitry and equipment. The partition wall is an example of so-called zone partitioning and may comprise an inner door through which access can be had to said circuitry and equipment. The inner door may be fitted with a lock, so that only authorised personnel can obtain access to the more sophisticated equipment. The electronic circuitry and equipment (not shown in FIG. 3) is located in the area marked "Zone C" of the cabinet shown in FIG. 3, whereas the climate conditioning plant is located in the area marked "Zone B" in FIG. 3. Zone B is an antechamber which contains a climate conditioning unit and diverse connections. The antechamber constitutes the entrance to an inner chamber comprised of Zone C. Radio components and other electronic circuitry and equipment is housed in the inner chamber. The area marked "Zone A" in FIG. 3 is the area external of the cabinet. The partition wall 62 forms an hermetic closure means between the plant 61 and the electronic circuitry and equipment. Two rubber bushings 66a, 66b or like seals are fitted on the side of the climate conditioning plant that lies proximal to the partition wall, adjacent two holes 67a and 67b in the climate conditioning plant. When the door is closed, the bushings lie sealingly against the partition wall in the vicinity of two further holes 68*a* and 68*b* in said wall. When the climate conditioning plant is in operation, acclimatized air circulates from said plant through the hole 67*b* and to said plant through the hole 67*a*, as shown by the arrows, or alternatively in a reverse pattern. This separation between the coarse entrance and the chamber with the aid of a partition wall means that only controlled air is able to circulate in the area housing said radio equipment. Rainwater, wash water or water condensate from the climate conditioning plant will be unable to reach the chamber in which the radio equipment is housed, since the partition wall functions as a barrier.

Figure 4:
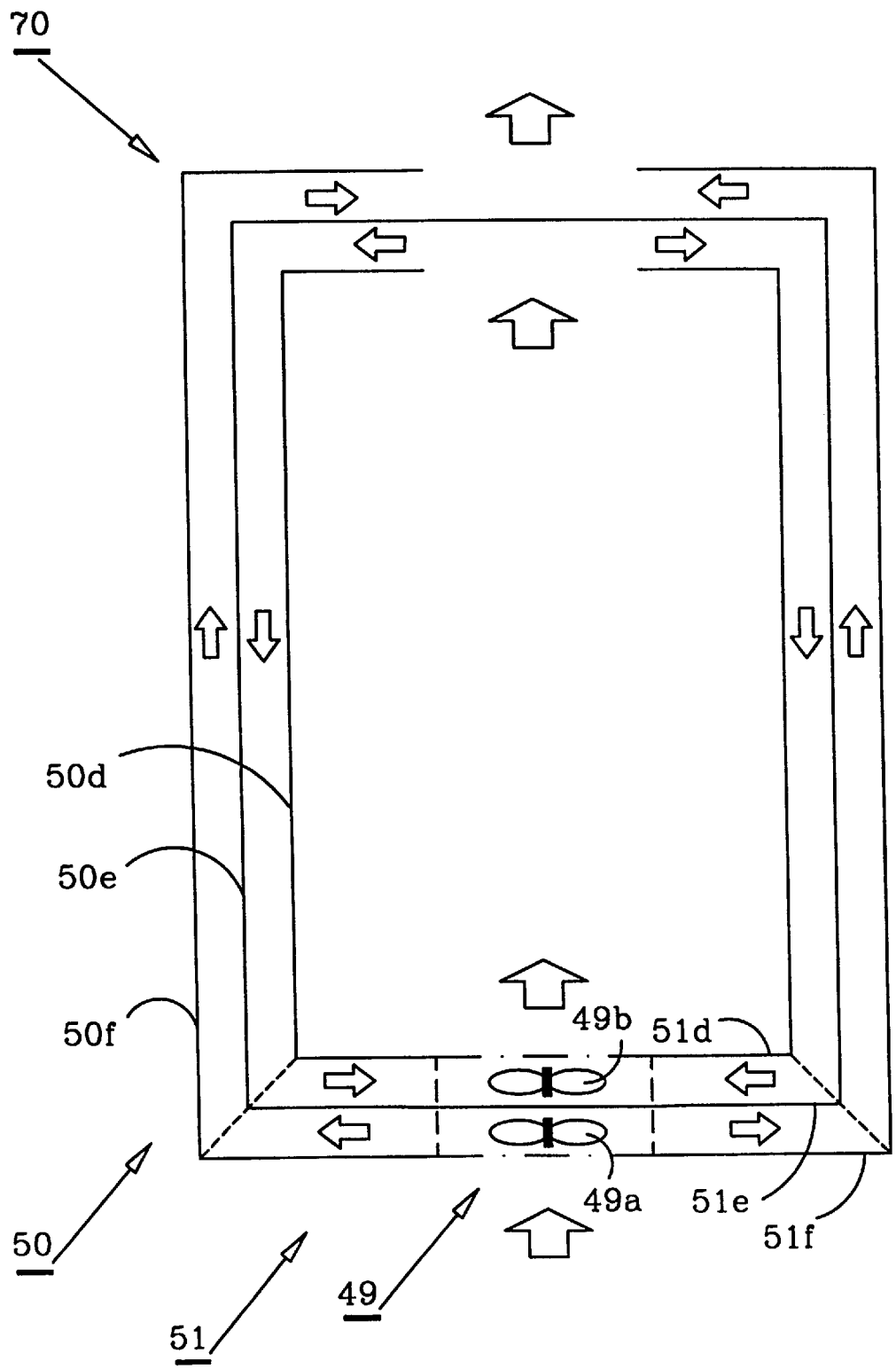
FIG. 4 is a sectional view of an embodiment with cooling channels in the profiles.

FIG. 4 is a sectional view of a further embodiment of a cabinet structure 70. The cabinet comprises a bent aluminium profile 50 and a straight aluminium profile 51. The bent profile 50 and the straight profile 51 both include an inner wall 50*d* and 51*d*. The two profiles also include a respective outer walls 50*f* and 51*f*. A profiled intermediate wall 50*e*, 51*e* is provided between the inner wall and outer wall of said profiles. The mutually opposing surfaces of the two profiles lie tightly against one another. This mutual abutment of said surfaces has been shown in broken lines. As in the case of the earlier embodiment, the two profiles together form the body of the cabinet. As in the earlier case, the electronic circuitry and equipment is housed within said body, and the electronic circuitry and equipment is also enclosed by a back piece and a front piece respectively, although not shown in FIG. 4. In the case of the FIG. 4 embodiment, a fan arrangement 49 comprising two fans, a first fan 49*a* and a second fan 49*b*, is provided in the straight profile 51. When the fans are running, the first fan 49*a* transports cold ambient air or cooled air from a climate conditioning plant in the direction of the arrows through the two profiles 51 and 50 between the outer walls 51*f*, 50*f* and the profiled intermediate walls 51*e*, 50*e* and out through the top of the cabinet as shown by the broader arrows. A coolant other than air may be used. The second fan 49*b* circulates air through the electronic circuitry and equipment and further through the bent profile 50 between the inner wall 50*d* and the profiled intermediate wall 50*e*, and through the straight profile 51 between the inner wall 51*d* and the profiled intermediate wall 51*e*, and back past the fan 49*b* and through said electronic circuitry and equipment. As the air passes the profiles between the inner walls and the profiled intermediate walls 50*e*, it is cooled by the cool air or coolant that passes between the profiled intermediate walls and the outer walls. This heat transfer contributes towards maintaining the electronic circuitry and equipment at a well-adapted temperature without needing to install bulky and costly heat exchangers. It is therefore unnecessary to provide a space-consuming heat exchanger in the proximity of a climate condition plant.

Figure 5:
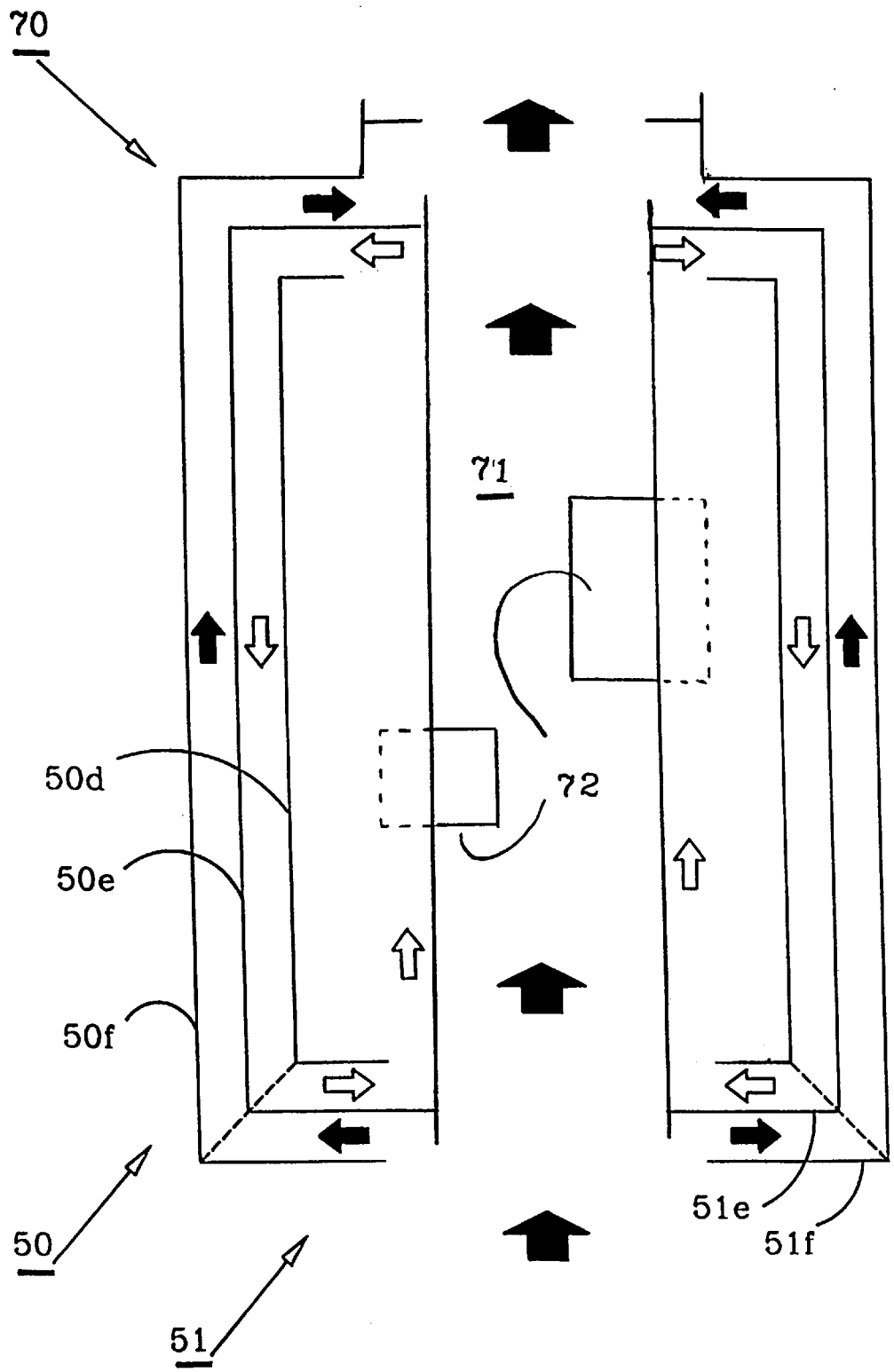
FIG. 5 is a modification of the embodiment according to FIG. 4 with an extra cooling channel for cooling certain components with ambient air.

FIG. 5 is a modification of the cabinet of FIG. 4 with a central cooling channel 71 in the middle of the cabinet. In this channel ambient air flows and the idea is to place components 72 with certain additional cooling needs in this channel. The particular construction of the cabinet with a body structure according to the invention makes it easy to incorporate a central channel of the kind in a housing for electronic equipment.

It will be understood that the invention is not restricted to the aforedescribed and illustrated exemplifying embodiments thereof and that modifications can be made within the scope of the accompanying claims. For instance, the bent, elongated profile need not have the U-shape shown in FIG. 2, but can be bent or angled at more than two places, so as to obtain other configurations. The profiles may be made of a material other than aluminium. Neither is it necessary to divide the cabinet into solely two zones. In the illustrated case, there is shown a cross-sectional configuration that includes three rectangular surfaces. It will be understood that other types of cross-sectional shapes can be used, for instance cross-sectional shapes having more or fewer rectangular surfaces. Other variants are also conceivable. The profiled intermediate wall shown in FIG. 4 may be a hollow profile provided with cooling fins. Coolants other than air are conceivable and more than one profiled intermediate wall may be provided between outer and inner walls. The profiled intermediate walls may also be disposed so as to obtain horizontal heat-exchange passageways. The various passageways and coolant flows are arranged in relation to one another so as to obtain the best possible heat transfer between the enclosed electronic circuitry/equipment and the coolant and outdoor air.

What is claimed is:

1. A cabinet structure enclosing electronic circuitry and electronic equipment, comprising an inner and outer walled body structure that surrounds said electronic circuitry and equipment, wherein said body structure comprises side parts, top and bottom parts of the cabinet and wherein said cabinet structure also includes a front piece and a back piece which together close the two sides of the body structure that are open towards said electronic circuitry and equipment wherein the inner and outer walled body structure comprises compression-moulded elongated hollow profile elements.

2. A cabinet structure according to claim 1, wherein one or several of the hollow profile elements are bent in one or several angles.

3. A cabinet structure according to claim 1, wherein the body structure comprises a bent hollow profile element and a straight hollow profile element, wherein the two end-parts of the straight hollow profile element lie in tight abutment with respective end-parts of the bent hollow profile element.

4. A cabinet structure according to claim 1, wherein at least one of the hollow straight and bent profile elements is a double-walled profile.

5. A cabinet structure according to claim 1, wherein the back and/or front piece is double-walled.

6. A cabinet structure according to claims 1, wherein the front piece includes an outer door.

7. A cabinet structure according to claims 1, wherein the straight and hollow profile elements include grooves for environmental and EMC seals, and seatings for receiving zone partitioning elements.

8. A cabinet structure according to claims 1, wherein the structure includes a partition wall between the front piece and the back piece.

9. A cabinet structure according to claim 8, wherein the partition wall separates the electronic circuitry and equipment from a climate conditioning plant intended for acclimatizing said electronic circuitry and equipment.

10. A cabinet structure according to claim 8, wherein the partition wall forms an hermetic closure between the electronic circuitry/equipment and the climate conditioning plant.

11. A cabinet structure according to claim 9, wherein the partition wall includes sealed air transits between the electronic circuitry/equipment and the climate conditioning plant.

12. A cabinet structure according to claims 1, wherein the bent hollow profile elements of the body structure each include an inner wall, an outer wall, and an intermediate wall which extends between the outer wall and the inner wall and which constitutes a heat-exchanging surface.

13. A cabinet structure according to claim 12, wherein a first side of the heat-exchanging surface functions to cool air passing said surface, whereafter said cooled air is transported through the enclosed electronic circuitry and equipment.

14. A cabinet structure according to claim 13, wherein a coolant passes a second side of the heat-exchanging surface.

15. A cabinet structure according to claim 12, wherein air and a coolant are both transported with the aid of a fan or compressor arrangement.

16. A cabinet structure according to claim 12, wherein a cooling channel is arranged in the middle of the cabinet in which the coolant flows in order to directly cool components with additional cooling needs.

* * * * *